(12) United States Patent
Morimoto et al.

(10) Patent No.: US 9,484,545 B2
(45) Date of Patent: Nov. 1, 2016

(54) ORGANIC ELECTROLUMINESCENT ELEMENT AND LIGHTING DEVICE

(71) Applicant: Lumiotec Inc., Yamagata (JP)

(72) Inventors: Mitsuru Morimoto, Yonezawa (JP); Junichi Tanaka, Yonezawa (JP); Koichi Mori, Yonezawa (JP)

(73) Assignee: Lumiotec, Inc., Yamagata (JP)

( * ) Notice: Subject to any disclaimer, the term of this patent is extended or adjusted under 35 U.S.C. 154(b) by 0 days.

(21) Appl. No.: 14/411,165

(22) PCT Filed: Jun. 24, 2013

(86) PCT No.: PCT/JP2013/067188
§ 371 (c)(1),
(2) Date: Dec. 24, 2014

(87) PCT Pub. No.: WO2014/002927
PCT Pub. Date: Jan. 3, 2014

(65) Prior Publication Data
US 2015/0207091 A1    Jul. 23, 2015

(30) Foreign Application Priority Data

Jun. 27, 2012    (JP) ................................. 2012-144789

(51) Int. Cl.
*H01L 51/50*    (2006.01)
*H05B 33/14*    (2006.01)

(52) U.S. Cl.
CPC ......... *H01L 51/504* (2013.01); *H01L 51/5016* (2013.01); *H01L 51/5044* (2013.01);
(Continued)

(58) Field of Classification Search
CPC ............. H01L 51/504; H01L 51/5016; H01L 51/5072; H01L 51/5092; H01L 51/5044
See application file for complete search history.

(56) References Cited

U.S. PATENT DOCUMENTS

| 4,539,507 A | 9/1985 | VanSlyke et al. |
| 4,769,292 A | 9/1988 | Tang et al. |

(Continued)

FOREIGN PATENT DOCUMENTS

| EP | 0 281 381 A2 | 9/1988 |
| EP | 1667494 A1 | 6/2006 |

(Continued)

OTHER PUBLICATIONS

Tang, C.W. et al., "Organic Electroluminescent Diodes", Appl. Phys. Lett., vol. 51, No. 12, (1987), pp. 913-915.

(Continued)

*Primary Examiner* — William Coleman
(74) *Attorney, Agent, or Firm* — Nixon Peabody LLP; Khaled Shami

(57) ABSTRACT

Provided is an organic electroluminescent element that can obtain white light with excellent color rendering properties and is particularly suitable for a light source of a lighting device. The organic electroluminescent element includes a plurality of light emitting units that are provided between a cathode and an anode and include at least a light emitting layer made of an organic compound. White light emitted from the plurality of light emitting units has a continuous emission spectrum (S) in a wavelength range of at least 380 nm to 780 nm. The emission spectrum (S) includes one peak wavelength ($p_1$) in a red wavelength range (R) of 600 nm to 640 nm, one peak wavelength ($p_2$) in a green wavelength range G of 500 nm to 540 nm, and two peak wavelengths ($p_3$) and ($p_4$) in a blue wavelength range B of 440 nm to 490 nm.

13 Claims, 15 Drawing Sheets

| CATHODE 100nm |
| ELECTRON TRANSPORT LAYER 50 nm |
| GREEN PHOSPHORESCENT LAYER 20 nm 20% |
| RED PHOSPHORESCENT LAYER 10nm 2% |
| HOLE TRANSPORT LAYER 45 nm |
| CHARGE GENERATION LAYER 20.3 nm |
| ELECTRON TRANSPORT LAYER 10 nm |
| BLUE FLUORESCENT LAYER 25nm 5% |
| HOLE TRANSPORT LAYER 105 nm |
| ANODE 300 nm |

(52) U.S. Cl.
CPC ....... *H01L51/5072* (2013.01); *H01L 51/5092* (2013.01); *H05B 33/14* (2013.01); *H01L 2251/5361* (2013.01); *H01L 2251/5376* (2013.01)

(56) References Cited

U.S. PATENT DOCUMENTS

| | | | |
|---|---|---|---|
| 4,774,435 | A | 9/1988 | Levinson |
| 4,794,302 | A | 12/1988 | Nire et al. |
| 4,885,211 | A | 12/1989 | Tang et al. |
| 7,985,974 | B2 * | 7/2011 | Nowatari et al. .............. 257/87 |
| 2005/0077817 | A1 | 4/2005 | Yamazaki et al. |
| 2006/0159951 | A1 | 7/2006 | Falcou et al. |
| 2006/0232194 | A1 | 10/2006 | Tung et al. |
| 2008/0268282 | A1 | 10/2008 | Spindler et al. |
| 2009/0072720 | A1 | 3/2009 | Lee et al. |
| 2012/0025180 | A1 | 2/2012 | Matsumoto |
| 2012/0074392 | A1 * | 3/2012 | Huang ............... H01L 27/3209 257/40 |
| 2013/0240859 | A1 | 9/2013 | Arakane et al. |

FOREIGN PATENT DOCUMENTS

| | | |
|---|---|---|
| EP | 2330654 A1 | 6/2011 |
| JP | 59-194393 A | 11/1984 |
| JP | 62-172691 A | 7/1987 |
| JP | 10-270171 A | 10/1988 |
| JP | 63-264692 A | 11/1988 |
| JP | 63-314795 A | 12/1988 |
| JP | 01-220394 A | 9/1989 |
| JP | 02-015595 A | 1/1990 |
| JP | 11-233262 A | 8/1999 |
| JP | 11-283751 A | 10/1999 |
| JP | 11-329748 A | 11/1999 |
| JP | 2000-182774 A | 6/2000 |
| JP | 2001-102175 A | 4/2001 |
| JP | 2001-202827 A | 7/2001 |
| JP | 2002-332567 A | 11/2002 |
| JP | 2003-045676 A | 2/2003 |
| JP | 2003-272860 A | 9/2003 |
| JP | 2006-024791 A | 1/2006 |
| JP | 2006-063233 A | 3/2006 |
| JP | 2006-287154 A | 10/2006 |
| JP | 2006-528421 A | 12/2006 |
| JP | 2007019070 A | 1/2007 |
| JP | 2007-066886 A | 3/2007 |
| JP | 2009500790 A | 1/2009 |
| JP | 2009-048829 A | 3/2009 |
| JP | 2009-224274 A | 10/2009 |
| JP | 2010157722 A | 7/2010 |
| JP | 2011-070963 A | 4/2011 |
| JP | 2011-077034 A | 4/2011 |
| JP | 2012-038523 A | 2/2012 |
| WO | 2010/113493 A1 | 10/2010 |
| WO | 2012/053216 A1 | 4/2012 |

OTHER PUBLICATIONS

Jis Z 8726:1990, with partial English language translation, 41 pages.
Jis Z 8724:1997, with partial English language translation, 54 pages.
Jis Z 8701:1999, with partial English language translation, 35 pages.
Jis Z 8725:1999, with partial English language translation, 47 pages.
Jis Z 9112:2004, with partial English language translation, 27 pages.
Jis Z 8720:2012, with partial English language translation, 37 pages.
International Search Report for PCT/JP2013/067188, mailed Sep. 17, 2013, 4 pages.
Japanese Office Action for Japanese Application No. JP2012-144789, mailed Mar. 7, 2015, 8 pages.
Office Action (Decision of Rejection) mailed Jul. 28, 2015 in Japanese Application No. 2012-144789.
Notice of Allowance, dated Sep. 6, 2016, issued in Japanese Patent Application No. 2015-211011, 6 pages.

* cited by examiner

FIG. 3

| CATHODE 100nm |
| --- |
| ELECTRON TRANSPORT LAYER 51 nm |
| GREEN PHOSPHORESCENT LAYER 20 nm 25% |
| RED PHOSPHORESCENT LAYER 10nm 2% |
| HOLE TRANSPORT LAYER 20 nm |
| CHARGE GENERATION LAYER 6.3 nm |
| ELECTRON TRANSPORT LAYER 25 nm |
| BLUE FLUORESCENT LAYER 25nm 5% |
| HOLE TRANSPORT LAYER 105 nm |
| ANODE 300 nm |

FIG. 5

| CATHODE 100nm |
|---|
| ELECTRON TRANSPORT LAYER 50 nm |
| GREEN PHOSPHORESCENT LAYER 20 nm 20% |
| RED PHOSPHORESCENT LAYER 10nm 2% |
| HOLE TRANSPORT LAYER 30 nm |
| CHARGE GENERATION LAYER 15.3 nm |
| ELECTRON TRANSPORT LAYER 15 nm |
| BLUE FLUORESCENT LAYER 25nm 5% |
| HOLE TRANSPORT LAYER 105 nm |
| ANODE 300 nm |

FIG. 7

| CATHODE 100nm |
|---|
| ELECTRON TRANSPORT LAYER 51 nm |
| GREEN PHOSPHORESCENT LAYER 20 nm 20% |
| RED PHOSPHORESCENT LAYER 10nm 2% |
| HOLE TRANSPORT LAYER 30 nm |
| CHARGE GENERATION LAYER 6.3 nm |
| ELECTRON TRANSPORT LAYER 25 nm |
| BLUE FLUORESCENT LAYER 25nm 5% |
| HOLE TRANSPORT LAYER 105 nm |
| ANODE 300 nm |

FIG. 9

| |
|---|
| CATHODE 100nm |
| ELECTRON TRANSPORT LAYER 51 nm |
| GREEN PHOSPHORESCENT LAYER 20 nm 20% |
| RED PHOSPHORESCENT LAYER 10nm 2% |
| HOLE TRANSPORT LAYER 40 nm |
| CHARGE GENERATION LAYER 6.3 nm |
| ELECTRON TRANSPORT LAYER 25 nm |
| BLUE FLUORESCENT LAYER 25nm 5% |
| HOLE TRANSPORT LAYER 105 nm |
| ANODE 300 nm |

FIG. 11

| |
|---|
| CATHODE 100nm |
| ELECTRON TRANSPORT LAYER 50 nm |
| GREEN PHOSPHORESCENT LAYER 20 nm 20% |
| RED PHOSPHORESCENT LAYER 10nm 2% |
| HOLE TRANSPORT LAYER 45 nm |
| CHARGE GENERATION LAYER 20.3 nm |
| ELECTRON TRANSPORT LAYER 10 nm |
| BLUE FLUORESCENT LAYER 25nm 5% |
| HOLE TRANSPORT LAYER 105 nm |
| ANODE 300 nm |

FIG. 13

| CATHODE 100nm |
|---|
| ELECTRON TRANSPORT LAYER 50 nm |
| GREEN PHOSPHORESCENT LAYER 20 nm 20% |
| RED PHOSPHORESCENT LAYER 10nm 2% |
| HOLE TRANSPORT LAYER 45 nm |
| CHARGE GENERATION LAYER 20.3 nm |
| ELECTRON TRANSPORT LAYER 10 nm |
| BLUE FLUORESCENT LAYER 25nm 5% |
| HOLE TRANSPORT LAYER 105 nm |
| ANODE 300 nm |

ORGANIC ELECTROLUMINESCENT ELEMENT AND LIGHTING DEVICE

CROSS-REFERENCE TO RELATED PATENT APPLICATIONS

The present application is a National Stage Application of International Application No. PCT/JP2013/067188 entitled "ORGANIC ELECTROLUMINESCENT ELEMENT AND LIGHTING DEVICE" filed Jun. 24, 2013, and which claims priority to Japanese Patent Application No. 2012-144789, filed Jun. 27, 2012, the contents of which are incorporated herein by reference in their entirety.

TECHNICAL FIELD

The present invention relates to an organic electroluminescent (EL) element and a lighting device.

BACKGROUND ART

An organic EL element is a self-luminous element in which a light emitting layer made of an organic compound is provided between a cathode and an anode that are opposite to each other. When a voltage is applied between the cathode and the anode, light is emitted by excitations which are generated by the recombination of electrons which are injected from the cathode to the light emitting layer and holes which are injected from the anode to the light emitting layer in the light emitting layer.

Tang et al. in Eastman Kodak Company succeeded in developing the following structure in order to improve the efficiency of an organic EL element: organic compounds with different carrier transport properties were laminated such that electrons and holes were respectively injected from a cathode and an anode with a good balance therebetween; the thickness of an organic layer interposed between the cathode and the anode was equal to or less than 2000 Å; and when a voltage of 10 V or less was applied, high brightness and efficiency sufficient to practically obtain 1000 cd/m² and an external quantum efficiency of 1% was obtained (see NPL 1).

According to the patent applied for by Tang et al., the overall thickness of the organic layer interposed between the cathode and the anode is equal to or less than 1 μm. Therefore, it is possible to provide a device which can emit light at a low applied voltage. Preferably, when the thickness of the organic layer is in the range of 1000 Å to 5000 Å, it is possible to obtain an electric field (V/cm) that is useful to emit light at an applied voltage of 25 V or less (see PTL 1 to PTL 6).

The organic EL element has been developed on the basis of the element structure disclosed by Tang et al.

As the element structure of the organic EL element, an organic EL element with a tandem structure in which a plurality of light emitting units, each of which is a unit including at least one light emitting layer, are laminated between a cathode and an anode so as to be connected in series to each other has been developed (see PTL 7 and PTL 8).

The organic EL element with the tandem structure has drawn attention as a technique which can achieve a long lifespan, high brightness, and uniform light emission from a large area which have not been achieved by the structure of the organic EL element developed by Tang et al. which requires a large amount of current even though the low voltage is applied.

In addition, an organic EL element with a multi-photon emission (MPE) structure has been developed in which an electrically insulating charge generation layer (CGL) is provided between a plurality of light emitting units (see PTL 9 and PTL 10). In the organic EL element with the MPE structure, when a voltage is applied between a cathode and an anode, charges in a charge-transfer complex are moved to the cathode and the anode. Holes are injected into one light emitting unit which is disposed close to the cathode, with respect to the charge generation layer interposed between one light emitting unit and the other light emitting unit, and electrons are injected into the other light emitting unit which is disposed close to the anode, with respect to the charge generation layer interposed between one light emitting unit and the other light emitting unit. In this way, light is simultaneously emitted from the plurality of light emitting units while the amount of current is maintained. Therefore, it is possible to obtain current efficiency and external quantum efficiency corresponding to the multiple of the number of light emitting units.

The organic EL element can switch light emission at high speed and has a simple element structure and a small thickness. Since the organic EL element has the above-mentioned excellent characteristics, it is applied to, for example, a display device of a mobile phone or an in-vehicle device. In recent years, the organic EL element has drawn attention, for example, as a backlight of a liquid crystal display or a lighting device for general lighting since it has thin surface emission characteristics.

However, when the organic EL element is applied to a lighting device, it is preferable to obtain white light with excellent color rendering properties. As a method for obtaining white light from the organic EL element, there are the following methods: a method which mixes light emitted from two light emitting materials of complementary colors, for example, a blue light emitting layer and a yellow light emitting layer to obtain white light; and a method which mixes light emitted from three (red, blue, and green) light emitting layers to obtain white light.

Among the methods, the method which mixes light emitted from three (red, blue, and green) light emitting layers is suitable for obtaining white light with high color rendering properties (see PTL 11 and PTL 12).

However, in the organic EL element according to the related art, the emission spectrum of the white light emitted from the three (red, blue, green) light emitting layers is not sufficiently controlled in order to obtain high color rendering properties. That is, the organic EL element according to the related art does not have a sufficient performance as a light source of a lighting device.

CITATION LIST

Patent Literature

[PTL 1] Japanese Unexamined Patent Application, First Publication No. S59-194393
[PTL 2] Japanese Unexamined Patent Application, First Publication No. S63-264692
[PTL 3] Japanese Unexamined Patent Application, First Publication No. H2-15595
[PTL 4] U.S. Pat. No. 4,539,507
[PTL 5] U.S. Pat. No. 4,769,292
[PTL 6] U.S. Pat. No. 4,885,211
[PTL 7] Japanese Unexamined Patent Application, First Publication No. H11-329748

[PTL 8] Japanese Unexamined Patent Application, First Publication No. 2003-45676
[PTL 9] Japanese Unexamined Patent Application, First Publication No. 2003-272860
[PTL 10] Japanese Unexamined Patent Application, First Publication No. 2006-24791
[PTL 11] Japanese Unexamined Patent Application, First Publication No. 2006-287154
[PTL 12] Japanese Unexamined Patent Application, First Publication No. 2009-224274

Non-Patent Literature

[NPL 1] Appl. Phys. Lett., 51, 913 (1987).

SUMMARY OF INVENTION

Technical Problem

The invention has been made in view of the above-mentioned problems of the related art and an object of the invention is to provide an organic electroluminescent element that can obtain white light with high color rendering properties and is particularly useful for a light source of a lighting device and a lighting device including the organic electroluminescent element.

Solution to Problem

According to the above-mentioned object of the invention, the invention provides the following means.

According to a first aspect of the invention, there is provided an organic electroluminescent element including: a cathode; an anode; and a plurality of light emitting units that are provided between the cathode and the anode and include at least a light emitting layer made of an organic compound. White light emitted from the plurality of light emitting units has a continuous emission spectrum in a wavelength range of at least 380 nm to 780 nm. The emission spectrum includes one peak wavelength in a red wavelength range of 600 nm to 640 nm, one peak wavelength in a green wavelength range of 500 nm to 540 nm, and two peak wavelengths in a blue wavelength range of 440 nm to 490 nm.

According to a second aspect of the invention, in the organic electroluminescent element according to the first aspect, in the green and blue wavelength ranges, a gap between adjacent peak wavelengths may be in a range of 15 nm to 50 nm.

According to a third aspect of the invention, in the organic electroluminescent element according to the second aspect, in the red and green wavelength ranges, a gap between adjacent peak wavelengths may be equal to or greater than 60 nm.

According to a fourth aspect of the invention, in the organic electroluminescent element according to any one of the first to third aspects, the emission intensity of one bottom wavelength between adjacent peak wavelengths in the red and green wavelength ranges may be lower than the emission intensity any one of two bottom wavelengths between adjacent peak wavelengths in the green and blue wavelength ranges.

According to a fifth aspect of the invention, in the organic electroluminescent element according to any one of the first to fourth aspects, the color of the emitted white light is any one of a daylight color (D), neutral white (N), and white (W) in a chromaticity range defined by "JIS Z 9112".

According to a sixth aspect of the invention, in the organic electroluminescent element according to any one of the first to fifth aspects, an average color rendering index (Ra) of the white light may be equal to or greater than 70.

According to a seventh aspect of the invention, in the organic electroluminescent element according to any one of the first to sixth aspects, the plurality of light emitting units may include: a first light emitting unit including a red phosphorescent layer that emits red light having one peak wavelength in the red wavelength range and a green phosphorescent layer that emits green light having one peak wavelength in the green wavelength range; and a second light emitting unit including a blue fluorescent layer that emits blue light having two peak wavelengths in the blue wavelength range.

According to an eighth aspect of the invention, in the organic electroluminescent element according to any one of the first to seventh aspects, the plurality of light emitting units may be laminated, with a charge generation layer interposed therebetween.

According to a ninth aspect of the invention, in the organic electroluminescent element according to the eighth aspect, the charge generation layer may be an electrically insulating layer made of an electron accepting material and an electron donating material and the resistivity of the electrically insulating layer may be equal to or greater than $1.0 \times 10^2$ Ω·cm.

According to a tenth aspect of the invention, in the organic electroluminescent element according to the ninth aspect, the resistivity of the electrically insulating layer may be equal to or greater than $1.0 \times 10^5$ Ω·cm.

According to an eleventh aspect of the invention, in the organic electroluminescent element according to the eighth aspect, the charge generation layer may be a mixed layer of different materials, in which one component is a metal oxide and the metal oxide forms a charge-transfer complex obtained by an oxidation reduction reaction. When a voltage is applied between the cathode and the anode, charges in the charge-transfer complex may be moved to the cathode and the anode, such that holes may be injected into one light emitting unit which is disposed close to the cathode, with respect to the charge generation layer interposed between one light emitting unit and the other light emitting unit, and that electrons may be injected into the other light emitting unit which is disposed close to the anode, with respect to the charge generation layer.

According to a twelfth aspect of the invention, in the organic electroluminescent element according to the eighth aspect, the charge generation layer may be a laminate of the electron accepting material and the electron donating material. When a voltage is applied between the cathode and the anode, charges which are generated at an interface between the electron accepting material and the electron donating material by a reaction involving the movement of electrons between the electron accepting material and the electron donating material may be moved to the cathode and the anode, such that holes may be injected into one light emitting unit which is disposed close to the cathode, with respect to the charge generation layer interposed between one light emitting unit and the other light emitting unit, and that electrons may be injected into the other light emitting unit which is disposed close to the anode, with respect to the charge generation layer.

According to a thirteenth aspect of the invention, there is provided a lighting device including the organic electroluminescent element according to any one of the first to twelfth aspects.

According to a fourteenth aspect of the invention, the lighting device according to the thirteenth aspect may further include an optical film that is provided on a light emission surface of the organic electroluminescent element.

According to a fifteenth aspect of the invention, the lighting device according to claim 14, the average color rendering index (Ra) of the white light may be equal to or greater than 90. Among color rendering indexes, R9 and R15 may be equal to or greater than 90.

Advantageous Effects of Invention

As described above, according to the invention, it is possible to provide an organic electroluminescent element that can obtain white light with high color rendering properties and a lighting device including the organic electroluminescent element.

BRIEF DESCRIPTION OF DRAWINGS

FIG. 3 is a cross-sectional view illustrating the element structure of an organic EL element according to Example 1.

FIG. 5 is a cross-sectional view illustrating the element structure of an organic EL element according to Example 2.

FIG. 7 is a cross-sectional view illustrating the element structure of an organic EL element according to Example 3.

FIG. 9 is a cross-sectional view illustrating the element structure of an organic EL element according to Example 4.

FIG. 11 is a cross-sectional view illustrating the element structure of an organic EL element according to Example 5.

FIG. 13 is a cross-sectional view illustrating the element structure of an organic EL element according to Example 6.

DESCRIPTION OF EMBODIMENTS

Figure 1:
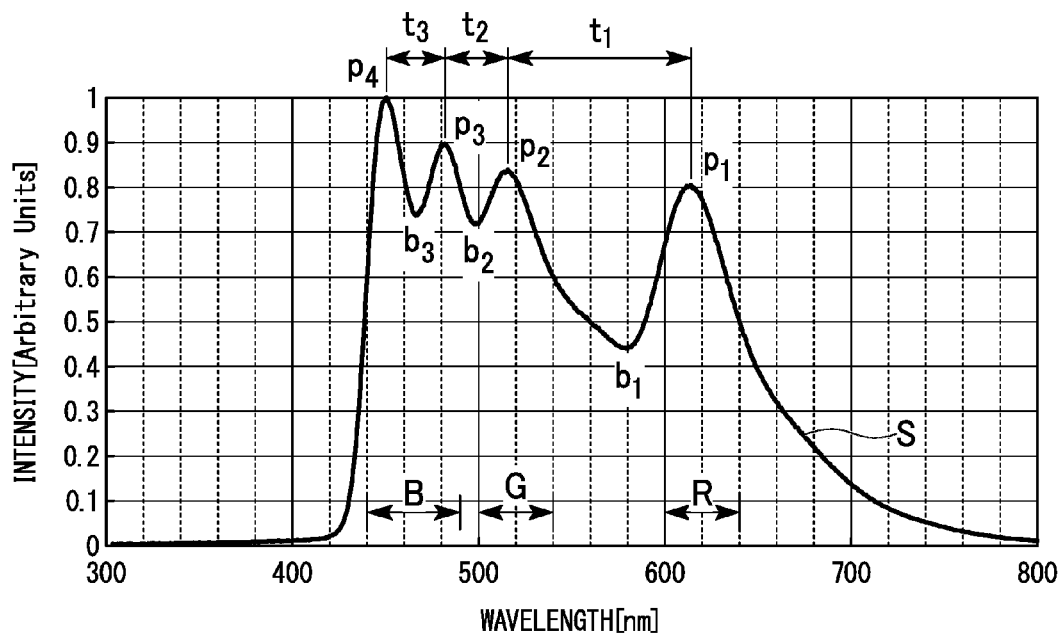
FIG. 1 is a graph illustrating an example of an emission spectrum of white light obtained by an organic EL element according to the invention.

Hereinafter, an organic electroluminescent (EL) element and a lighting device according to the invention will be described in detail with reference to the drawings.

In the drawings used in the following description, in some cases, a characteristic portion is enlarged for convenience and ease of understanding and the dimensions and ratio of each component may not be the same as the actual dimensions and ratio. In addition, for example, materials and dimensions which are exemplified in the following description are illustrative examples and the invention is not limited thereto. Various modifications and changes can be made, without departing from the scope and spirit of the invention.

An organic EL element according to the invention includes a plurality of light emitting units that are provided between a cathode and an anode and include at least a light emitting layer made of an organic compound. White light which is emitted from the plurality of light emitting units has a continuous emission spectrum in a wavelength range of at least 380 nm to 780 nm. The emission spectrum has one peak wavelength in a red wavelength range of 600 nm to 640 nm, one peak wavelength in a green wavelength range of 500 nm to 540 nm, and two peak wavelengths in a blue wavelength range of 440 nm to 490 nm.

FIG. 1 is a graph illustrating an example of the emission spectrum of white light obtained by the organic EL element according to the invention.

Specifically, as shown in FIG. 1, the white light obtained by the organic EL element is so-called visible light and has an emission spectrum S which is continuous in the wavelength range of at least nm 380 to 780 nm.

The emission spectrum S has one peak wavelength $p_1$ in a red wavelength range R of 600 nm to 640 nm, one peak wavelength $p_2$ in a green wavelength range G of 500 nm to 540 nm, and two peak wavelengths $p_3$ and $p_4$ in a blue wavelength range B of 440 nm to 490 nm.

In the red and green wavelength ranges (500 nm to 640 nm), a gap $t_1$ between two adjacent peak wavelengths $p_1$ and $p_2$ is preferably equal to or greater than 60 nm. In the green and blue wavelength ranges (440 nm to 540 nm), gaps $t_2$ and $t_3$ between three adjacent peak wavelengths $p_2$, $p_3$, and $p_4$ are preferably in the range of 15 nm to 50 nm.

Figure 2:
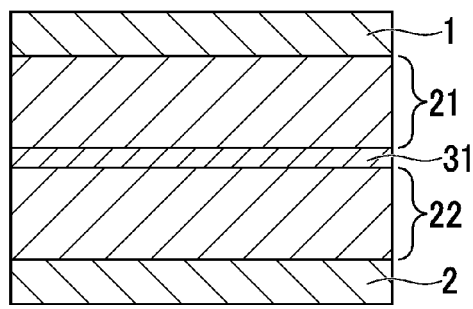
FIG. 2 is a cross-sectional view illustrating an example of the element structure of the organic EL element according to the invention.

The emission intensity of one bottom wavelength $b_1$ between two adjacent peak wavelengths $p_1$ and $p_2$ in the red and green wavelength ranges (500 nm to 640 nm) is preferably lower than that of any one of two bottom wavelengths $b_2$ and $b_3$ between three adjacent peak wavelengths $p_2$, $p_3$, and $p_4$ in the green and blue wavelength ranges (440 nm to 540 nm) (In FIG. 2, the emission intensity of the bottom wavelength $b_1$ is lower than that of the bottom wavelengths $b_2$ and $b_3$).

Therefore, the organic EL element according to the invention can obtain white light with high color rendering properties. Specifically, the organic EL element can obtain white light corresponding to any one of a daylight color (D), neutral white (N), and white (W) in the chromaticity range defined by "JIS Z 9112". In addition, the organic EL element can obtain white light with an average color rendering index (Ra) of 70 or more (preferably, 80 or more).

In the invention, the organic EL element which obtains white light with high color rendering properties can be preferably applied as, for example, a backlight of a liquid crystal display or a light source of a lighting device for general lighting. That is, the lighting device including the organic EL element according to the invention can emit white light with high color rendering properties. In addition, in the invention, the organic EL element is not limited to the light source of the lighting device, but can be used for various purposes.

For example, preferably, the organic EL element according to the invention has the following structure as an element structure for obtaining white light having an emission spectrum S with high color rendering properties, as shown in FIG. 2: a structure (tandem structure) in which a first light emitting unit 21 including a red phosphorescent layer that emits red light with one peak wavelength $p_1$ in the red wavelength range R and a green phosphorescent layer that emits green light with one peak wavelength $p_2$ in the green wavelength range G and a second light emitting unit 22 including a blue fluorescent layer that emits blue light with two peak wavelengths $p_3$ and $p_4$ in the blue wavelength range B are laminated between a cathode 1 and an anode 2.

Preferably, the organic EL element according to the invention has a structure (MPE structure) in which the first and second light emitting units 21 and 22 are laminated with a charge generation layer (CGL) 31 interposed therebetween.

The cathode 1 is preferably made of, for example, metal with a small work function, an alloy of the metal, or a metal oxide. Specifically, for example, the cathode 1 can be made of single metal including alkali metal, such as Li, alkali earth metal, such as Mg or Ca, and rare earth metal, such as Eu, or alloys including the metal, Al, Ag, and In.

For example, an organic layer doped with metal may be used as the interface between the cathode 1 and the organic layer, as disclosed in "Japanese Unexamined Patent Application, First Publication No. H10-270171" or "Japanese Unexamined Patent Application, First Publication No. 2001-102175". In this case, the cathode 1 may be made of a conductive material and the properties of the conductive material, such as a work function, are not particularly limited.

In addition, the organic layer which comes into contact with the cathode 1 may be made of an organic metal complex compound including at least one of alkali metal ions, alkali earth metal ions, and rare earth metal ions, as disclosed in, for example, "Japanese Unexamined Patent Application, First Publication No. H11-233262" or "Japanese Unexamined Patent Application, First Publication No. 2000-182774". In this case, the cathode 1 can be made of a metal material which can reduce the metal ions included in the organic metal complex compound in vacuum, for example, a (thermally reducible) metal material, such as Al, Zr, Ti, or Si, or alloys including the metal materials. Among the metal materials, in particular, Al which is generally widely used as a material forming a wiring electrode is preferably used in terms of, for example, ease of deposition, the level of reflectance, and chemical stability.

The material forming the anode 2 is not particularly limited. However, when light is emitted from the anode 2, the anode 2 can be made of a transparent conductive material, such as an indium tin oxide (ITO) or an indium zinc oxide (IZO).

When an ITO film is formed through a sputtering method that does not damage the organic film, using the method disclosed in, for example, "Japanese Unexamined Patent Application, First Publication No. 2002-332567," the organic layer doped with metal which is disclosed in "Japanese Unexamined Patent Application, First Publication No. H10-270171" is used for an electron injection layer, which makes it possible to use the transparent conductive material, such as ITO or IZO, for the cathode 1.

Therefore, both the cathode 1 and the anode 2 are transparent (since the first and second light emitting units (organic films) 21 and 22 and the charge generation layer 31 are all transparent) and it is possible to manufacture a transparent organic EL element. In addition, contrary to a general organic EL element, the anode 2 may be made of a metal material and the cathode 1 may be made of a transparent conductive material. In this case, it is possible to emit light from the cathode 1. Regarding deposition order, deposition does not necessarily have to start from the anode 2, but may start from the cathode 1.

The first and second light emitting units 21 and 22 can have various structures, similarly to the organic EL element according to the related art. When the first and second light emitting units 21 and 22 include at least a light emitting layer made of an organic compound, they may have any laminated structure. For example, an electron transport layer or an electron injection layer can be arranged on the side of the light emitting layer close to the cathode 1 and a hole transport layer or a hole injection layer can be arranged on the side of the light emitting layer close to the anode 2.

The electron transport layer may be made of an electron transporting material according to the related art. In general, among the electron transporting materials used for the organic EL element, it is preferable to use an electron transporting material which has a hole blocking function in order to maintain the carrier balance, in addition to excellent electron transport properties. Specifically, it is preferable to use an electron transporting material with a highest occupied molecular orbital (HOMO) value of 6.0 eV or more. The electron injection layer is inserted between the cathode 1 and the electron transport layer or between the charge generation layer 31 and the electron transport layer which is disposed close to the anode 2, in order to improve the injection efficiency of electrons from the cathode 1 or the charge generation layer 31. In general, an electron transporting material which has the same properties as the electron transport layer is used. In some cases, a set of the electron transport layer and the electron injection layer is referred to as an electron transport layer.

The hole transport layer may be made of a hole transporting material according to the related art. The hole transporting material is not particularly limited. However, for example, it is preferable to use an organic compound (electron donating material) which has a hole transport property, that is, an electron donating property and has a HOMO value of less than 5.7 eV. The hole injection layer is inserted between the anode 2 and the hole transport layer or between the charge generation layer 31 and the hole transport layer which is disposed close to the cathode 1, in order to improve the injection efficiency of holes from the anode 2 or the charge generation layer 31. In general, an electron donating material which has the same properties as the hole transport layer is used. In some cases, a set of the hole transport layer and the hole injection layer is referred to as a hole transport layer.

For example, a vapor deposition method or a spin coating method can be used as a method for forming each layer of the first and second light emitting units 21 and 22. For example, the electron transport layer, the electron injection layer, the hole transport layer, and the hole injection layer can be made of the materials according to the related art.

In general, the red, green, and blue light emitting layers forming the first and second light emitting units 21 and 22 include a host material, which is a major component, and a guest material, which is a minor component, as an organic compound. In particular, red, green, and blue light components are emitted due to the properties of the guest material.

The guest material is also referred to as a dopant material. A material in which the guest material emits fluorescence is generally referred to as a fluorescent material and the light emitting layer made of the fluorescent material is referred to as a fluorescent layer. A material in which the guest material emits phosphorescence is generally referred to as a phosphorescent material and the light emitting layer made of the phosphorescent material is referred to as a phosphorescent layer.

Among them, the phosphorescent layer can use 25% of triplet excitations which are generated by the movement of energy from singlet excitations, in addition to 75% of triplet excitations which are generated by recombination of electrons and holes. Therefore, theoretically, 100% internal quantum efficiency is obtained.

That is, the excitations generated by the recombination of electrons and holes are converted into light, without generating heat inactivation in the light emitting layer. In practice, in an organic metal complex including heavy atoms, such as iridium or platinum, internal quantum efficiency close to 100% is obtained by, for example, optimizing the element structure.

The guest material of the phosphorescent layer is not particularly limited. However, for example, the red phosphorescent layer can be made of a red phosphorescent material such as $Ir(piq)_3$ or $Ir(btpy)_3$. The green phosphorescent layer can be made of a green phosphorescent material such as $Ir(ppy)_3$. The blue phosphorescent layer can be made of a blue phosphorescent material such as $Ir(Fppy)_3$.

For example, an electron transport material, a hole transport material, or a mixture thereof can be used as the host material of the phosphorescent layer. Specifically, for example, 4,4'-bis(carbazolyl)-biphenyl (CBP) or 2,9-dimethyl-4,7-diphenyl-9,10-phenanthroline (BCP) can be used as the host material.

In the invention, it is preferable to use a blue fluorescent material as the guest material of the blue light emitting layer in order to increase the lifespan of the element and obtain high color rendering properties. For example, the blue fluorescent material described in paragraphs [0052] to [0061] of "PCT International Publication No. WO2012/053216" can be used as the host material and the guest material of the blue fluorescent layer. For example, a styrylamine compound, a fluoranthene compound, an aminopyrene compound, or a boron complex can be used as the guest material.

However, in the invention, blue light emitted from the blue fluorescent layer has two peak wavelengths $p_3$ and $p_4$. In general, there is a light emitting material having a plurality of peak wavelengths in a given wavelength range. However, when the application of the light emitting material to a display device is considered, a method which designs the element structure such that one peak wavelength is emphasized is used in order to improve color impurity. Specifically, there is a method which sets the thickness of a film such that the maximum emission intensity is obtained at a given wavelength, using light interference. The invention is mainly applied to a lighting device. In this case, it is preferable to design light interference such that blue light does not have one peak wavelength in the blue wavelength range, in order to obtain white light with high color rendering properties.

The charge generation layer 31 is an electrically insulating layer which is made of an electron accepting material and an electron donating material. The resistivity of the electrically insulating layer is preferably equal to or greater than $1.0 \times 10^2$ Ω·cm and more preferably equal to or greater than $1.0 \times 10^5$ Ω·cm.

The charge generation layer 31 may be a mixed layer of different materials, in which one component is a metal oxide and the metal oxide forms a charge-transfer complex obtained by an oxidation reduction reaction. In this case, when a voltage is applied between the cathode 1 and the anode 2, charges in the charge-transfer complex are moved to the cathode 1 and the anode 2. Then, holes are injected into one light emitting unit (the first light emitting unit 21 or the second light emitting unit 22) which is disposed close to the cathode 1, with respect to the charge generation layer 31 interposed therebetween, and electrons are injected into the other light emitting unit (the second light emitting unit 22 or the first light emitting unit 21) which is disposed close to the anode 2, with respect to the charge generation layer 31 interposed therebetween. In this way, light is simultaneously emitted from the first and second light emitting units 21 and 22 with the same amount of current. Therefore, it is possible to obtain current efficiency and external quantum efficiency corresponding to the multiple of the number of light emitting units 21 and 22.

The charge generation layer 31 may be a laminated layer of the electron accepting material and the electron donating material. In this case, when a voltage is applied between the cathode 1 and the anode 2, charges which are generated at the interface between the electron accepting material and the electron donating material by a reaction involving the movement of electrons between the electron accepting material and the electron donating material are moved to the cathode 1 and the anode 2. Then, holes are injected into one light emitting unit (the first light emitting unit 21 or the second light emitting unit 22) which is disposed close to the cathode 1, with respect to the charge generation layer 31 interposed therebetween, and electrons are injected into the other light emitting unit (the second light emitting unit 22 or the first light emitting unit 21) which is disposed close to the anode 2, with respect to the charge generation layer 31 interposed therebetween. In this way, light is simultaneously emitted from the first and second light emitting units 21 and 22 with the same amount of current. Therefore, it is possible to obtain current efficiency and external quantum efficiency corresponding to the multiple of the number of light emitting units 21 and 22.

The materials described in PTL 9 can be used as a detailed example of the material forming the charge generation layer 31. For example, among the materials, the material which is described in paragraphs [0019] to [0021] can be preferably used. In addition, the materials described in paragraphs [0023] to [0026] of "PCT International Publication No. WO2010/113493" can be used. Among them, in recent years, particularly, the strong electron accepting material (HATCN6) described in paragraph [0059] has been generally used for the charge generation layer 31.

The lighting device according to the invention can have a structure in which an optical film for improving a color rendering property is provided on a light emission surface of the organic EL element.

In general, the color rendering property is evaluated by the average color rendering index (Ra). The average color rendering index (Ra) is represented by the average value of eight types of color rendering indexes (R1 to R8). In addition, there are special color rendering indexes, such as R9 for evaluating the reproducibility of a red color, R13 for evaluating the reproducibility of the skin color of a westerner, and R15 for evaluating the reproducibility of the skin color of the Japanese.

The optical film used in the invention covers a depression (bottom wavelength $b_1$) which appears in the wavelength range of 540 nm to 580 nm in the emission spectrum S and is used to further improve the color rendering property. That is, the coverage of the wavelength range of 540 nm to 580 nm is very effective in improving the average color rendering index (Ra) and the special color rendering index.

In general, in the organic EL element, light is emitted from a light emitting layer with a high refractive index (a refractive index of about 1.6 to 2.1) and only 15% to 20% of light emitted from the light emitting layer is emitted to the outside. The reason is as follows: light which is incident on the interface at an angle equal to or greater than a critical angle is totally reflected from the interface and is not emitted to the outside of the element; or light is totally reflected between the transparent electrode or the light emitting layer and the transparent substrate, travels along the transparent electrode or the light emitting layer, and is emitted in the side surface direction of the element.

As a method for improving the emission efficiency of light, for example, there are the following methods: a method in which an uneven portion is formed in the surface of a transparent substrate to prevent total reflection at the interface between the transparent substrate and air (for example, see "U.S. Pat. No. 4,774,435"); a method which provides a substrate with a light focusing function to improve efficiency (for example, see "Japanese Unexamined Patent Application, First Publication No. S63-314795"); a method which forms a reflecting surface on, for example, the side surface of an element (for example, see "Japanese Unexamined Patent Application, First Publication No. H1-220394"); a method which provides a flat layer with an intermediate refractive index between a substrate and a luminous body to form an anti-reflection film (for example, see "Japanese Unexamined Patent Application, First Publication No. S62-172691"); a method which provides a flat layer with a lower refractive index than a substrate between the substrate and a luminous body (for example, see "Japanese Unexamined Patent Application, First Publication No. 2001-202827"); and a method which forms a diffraction grating (between a substrate and the outside including) between the substrate and a transparent electrode layer or a light emitting layer (for example, see "Japanese Unexamined Patent Application, First Publication No. H11-283751").

In the lighting device, in order to improve the color rendering property, for example, the following structures can be used: a structure in which a microlens array is further provided on the surface of the optical film; and a structure in which a condensing sheet is combined with the element to focus light in a Specific direction, for example, a frontward direction with reference to the light emission surface of the element, thereby improving brightness in the specific direction. In addition, a light diffusion film may also be used as the condensing sheet in order to control the radiation angle of light from the organic EL element. For example, a light diffusion film (Light-up) manufactured by Kimoto Co., Ltd. can be used as the light diffusion film.

The invention is not necessarily limited to the above-mentioned embodiment, and various modifications and changes of the invention can be made without departing from the scope and spirit of the invention.

Specifically, in the organic EL element according to the invention, the element structure shown in FIG. 2 is preferably used as the element structure for obtaining white light having the emission spectrum S with high color rendering properties shown in FIG. 1. However, the organic EL element is not necessarily limited to the element structure. That is, as the element structure of the organic EL element according to the invention, various element structures or materials can be used as long as they can obtain white light having the emission spectrum S with high color rendering properties shown in FIG. 1.

EXAMPLES

Hereinafter, the effect of the invention will become apparent from the following examples. The invention is not limited to the following examples, but can be appropriately changed without departing from the scope and spirit of the invention.

Example 1

In Example 1, an organic EL element having an element structure shown in FIG. 3 was manufactured. Specifically, first, a soda lime glass substrate which had a thickness of 0.7 mm and on which an ITO film having a thickness of 300 nm, a width of 2 mm, and a sheet resistance of about 10 Ω/□ was formed was prepared. Then, ultrasonic cleaning was performed on the substrate for 5 minutes with a neutral detergent, ion-exchange water, acetone, and isopropyl alcohol. Then, spin-drying and UV/$O_3$ treatment were sequentially performed on the substrate.

Then, deposition crucibles (made of tantalum or alumina) of a vapor deposition apparatus were filled with materials forming the layers shown in FIG. 3. Then, the substrate was set in the vapor deposition apparatus. Power was supplied to heat the deposition crucibles in a reduced pressure atmosphere with a degree of vacuum of $1 \times 10^{-4}$ Pa or less and each layer was deposited with a predetermined thickness at a deposition speed of 0.1 nm/s. In addition, power was supplied to the deposition crucibles to perform co-deposition such that a layer made of two or more materials, such as a light emitting layer, was formed at a predetermined mixture ratio. A cathode was deposited with a predetermined thickness at a deposition speed of 1 nm/s.

A power supply (KEITHLEY2425) was connected to the manufactured organic EL element and a constant current of 4 mA/$cm^2$ was supplied to the current organic EL element such that the organic EL element emitted light. In this case, the emission spectrum of light which was emitted in the front direction of the organic EL element was measured by a multi-channel analyzer (PMA-11 manufactured by Hamamatsu Photonics K.K.).

Figure 4:
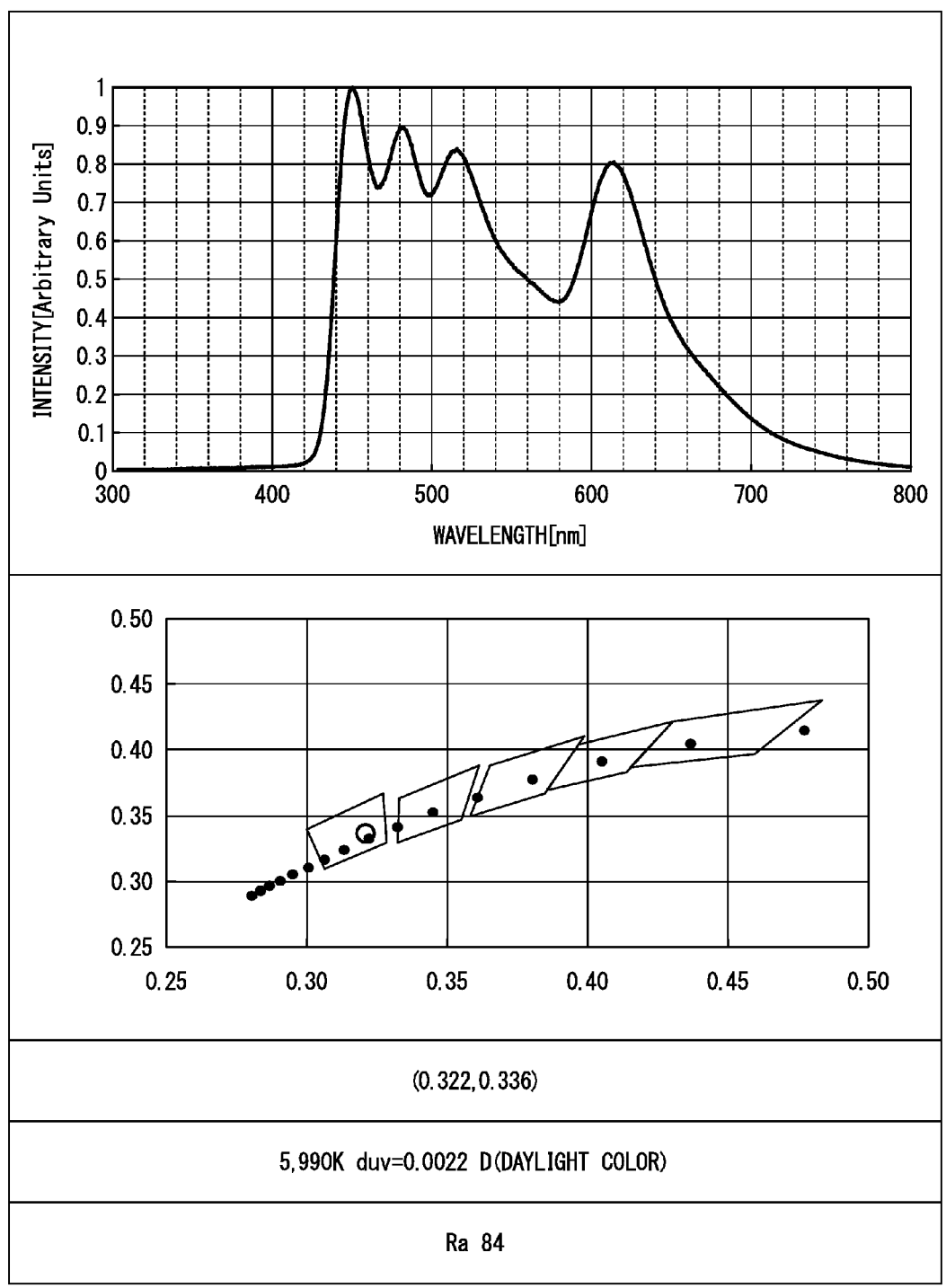
FIG. 4 is a diagram illustrating the evaluation result of the organic EL element according to Example 1.

Then, the color of the emitted light was evaluated with the chromaticity coordinates of the CIE color system on the basis of the measurement result. In addition, the color of the emitted light was classified according to the light-source color defined by "JIS Z 9112" on the basis of the chromaticity coordinates. A deviation duv was derived from a black body locus on the basis of "JIS Z 8725". In addition, the average color rendering index (Ra) of the color of the emitted light was derived by a method defined by "JIS Z 8726". The evaluation result obtained from the above-mentioned results is shown in FIG. 4.

Example 2

Figure 6:
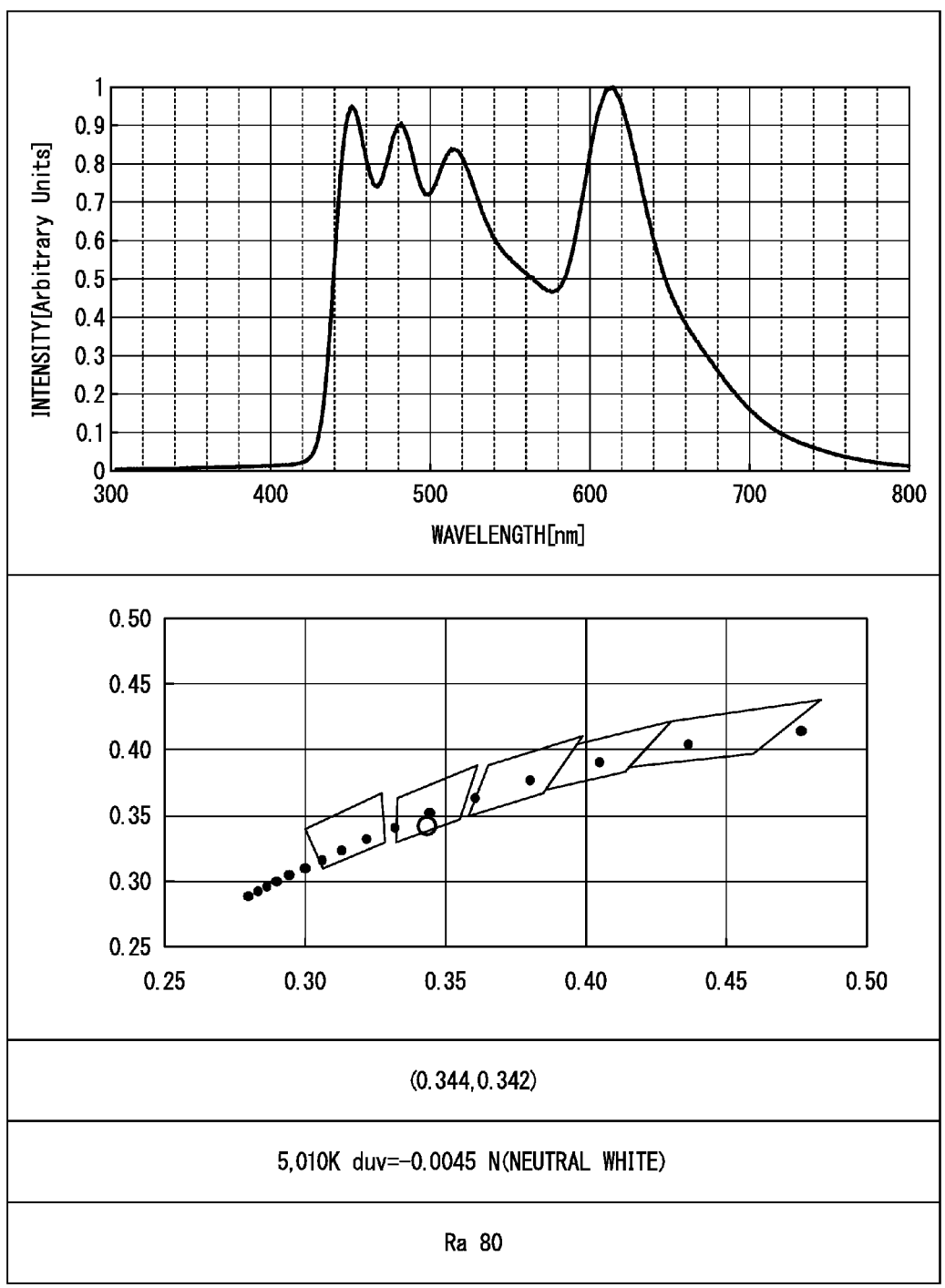
FIG. 6 is a diagram illustrating the evaluation result of the organic EL element according to Example 2.

In Example 2, an organic EL element having an element structure shown in FIG. 5 was manufactured by the same manufacturing method as that in Example 1. Then, the organic EL element according to Example 2 was evaluated by the same method as that in Example 1. The evaluation result is shown in FIG. 6.

Example 3

Figure 8:
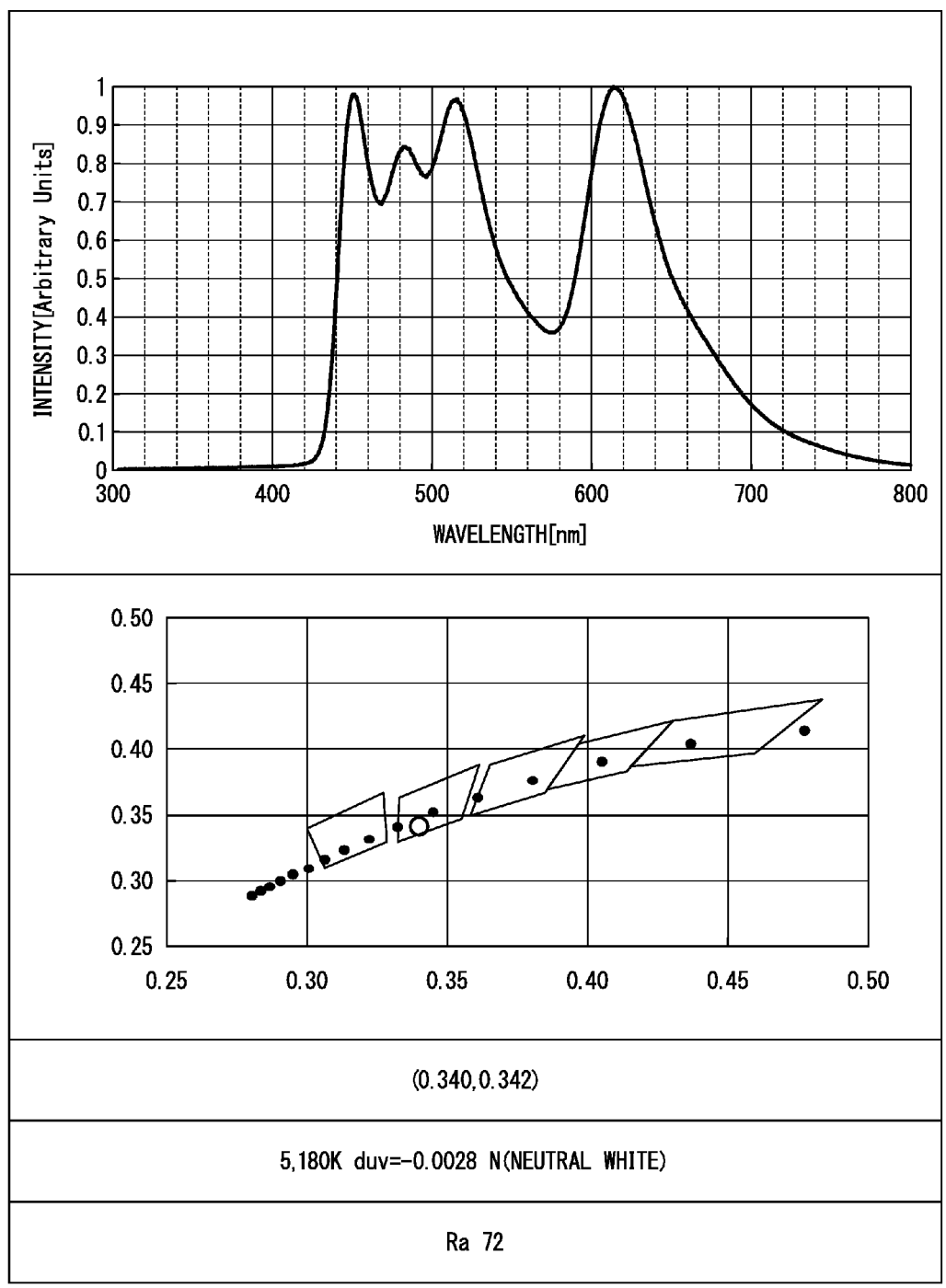
FIG. 8 is a diagram illustrating the evaluation result of the organic EL element according to Example 3.

In Example 3, an organic EL element having an element structure shown in FIG. 7 was manufactured by the same manufacturing method as that in Example 1. Then, the organic EL element according to Example 3 was evaluated by the same method as that in Example 1. The evaluation result is shown in FIG. 8.

Example 4

Figure 10:
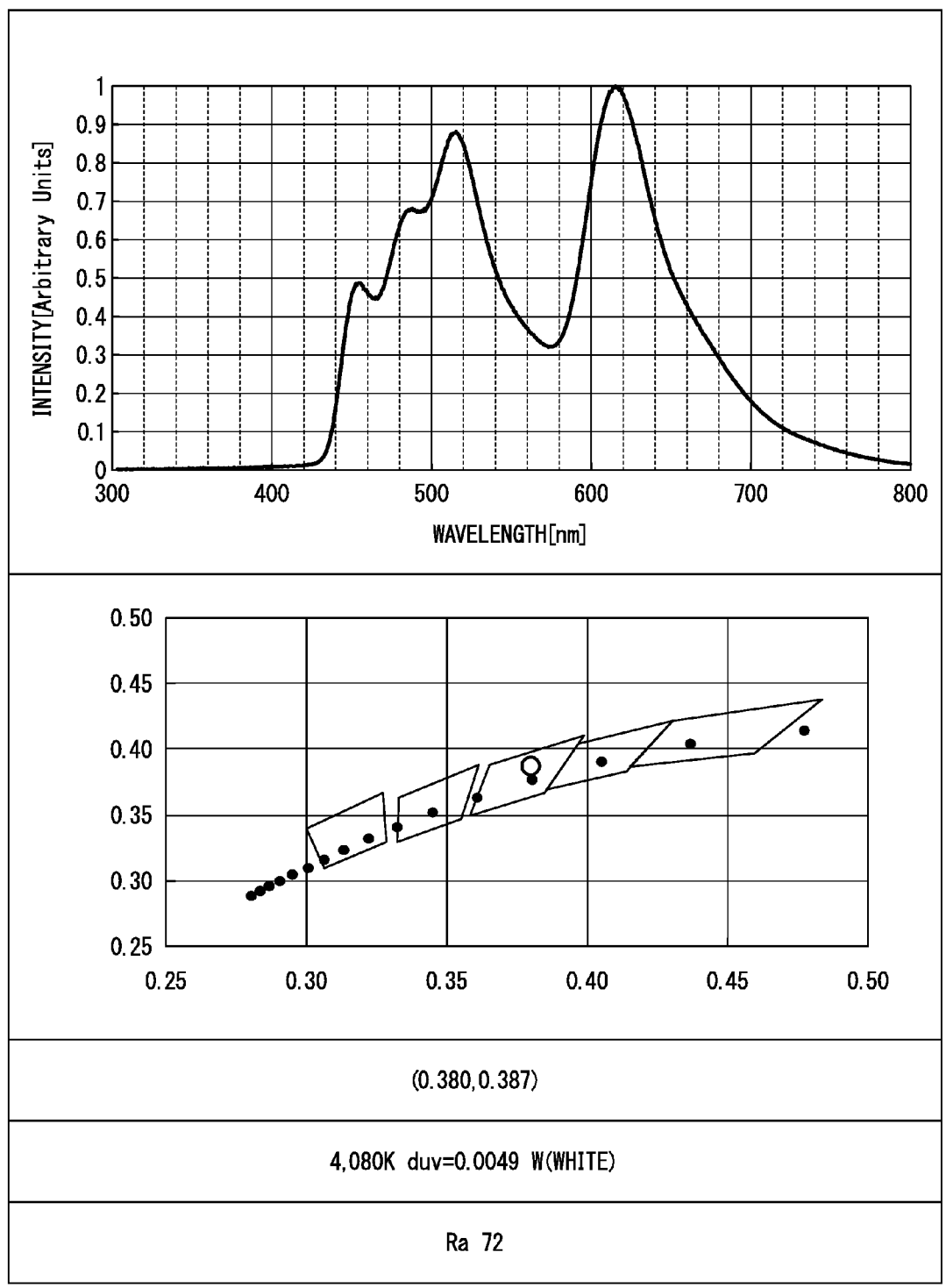
FIG. 10 is a diagram illustrating the evaluation result of the organic EL element according to Example 4.

In Example 4, an organic EL element having an element structure shown in FIG. 9 was manufactured by the same manufacturing method as that in Example 1. Then, the organic EL element according to Example 4 was evaluated by the same method as that in Example 1. The evaluation result is shown in FIG. 10.

Example 5

Figure 12:
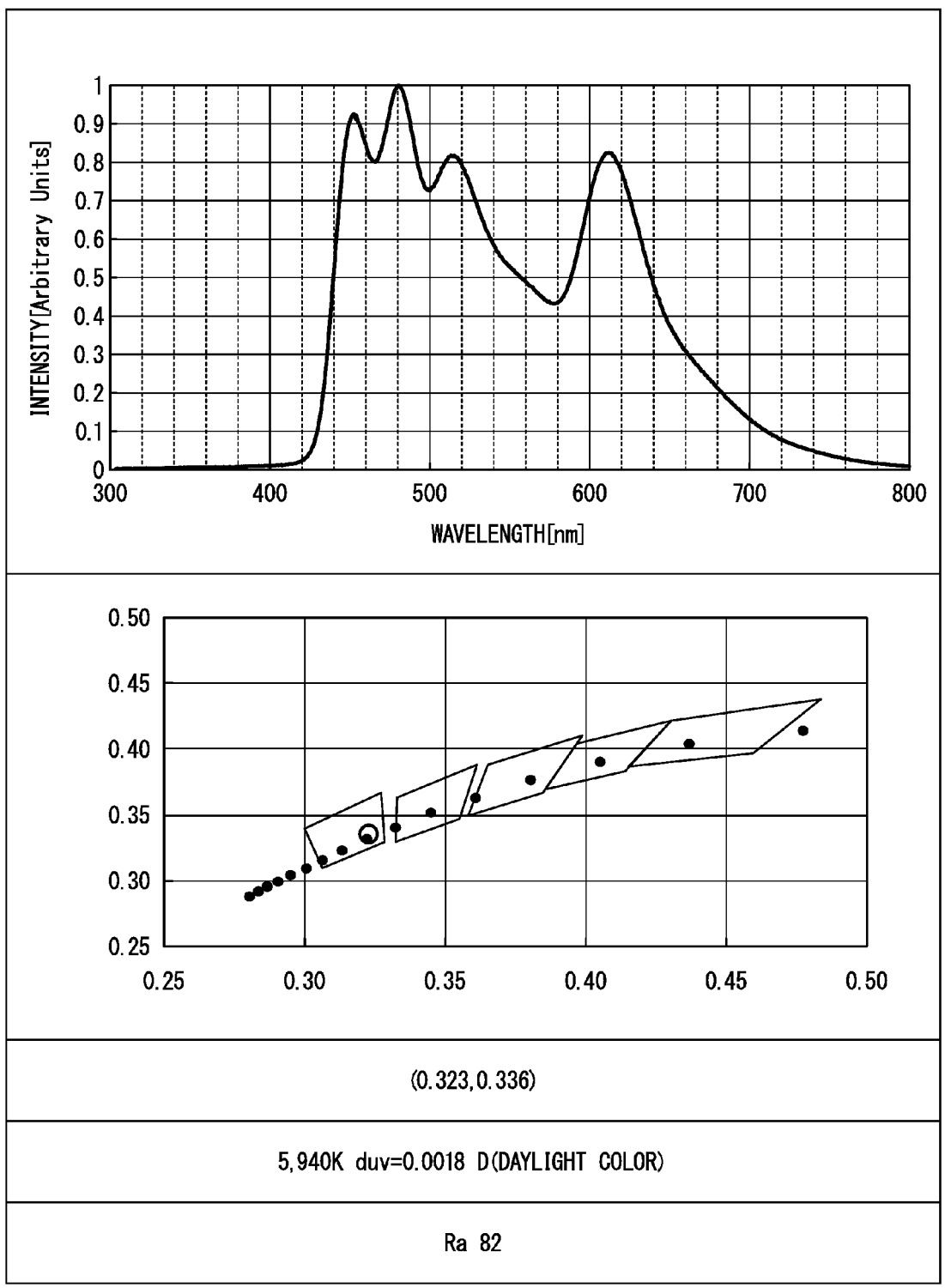
FIG. 12 is a diagram illustrating the evaluation result of the organic EL element according to Example 5.

In Example 5, an organic EL element having an element structure shown in FIG. 11 was manufactured by the same manufacturing method as that in Example 1. Then, the organic EL element according to Example 5 was evaluated by the same method as that in Example 1. The evaluation result is shown in FIG. 12. However, FIG. 12 shows the evaluation result when a constant current of 6 mA/cm² flows, unlike other examples.

Example 6

Figure 14:
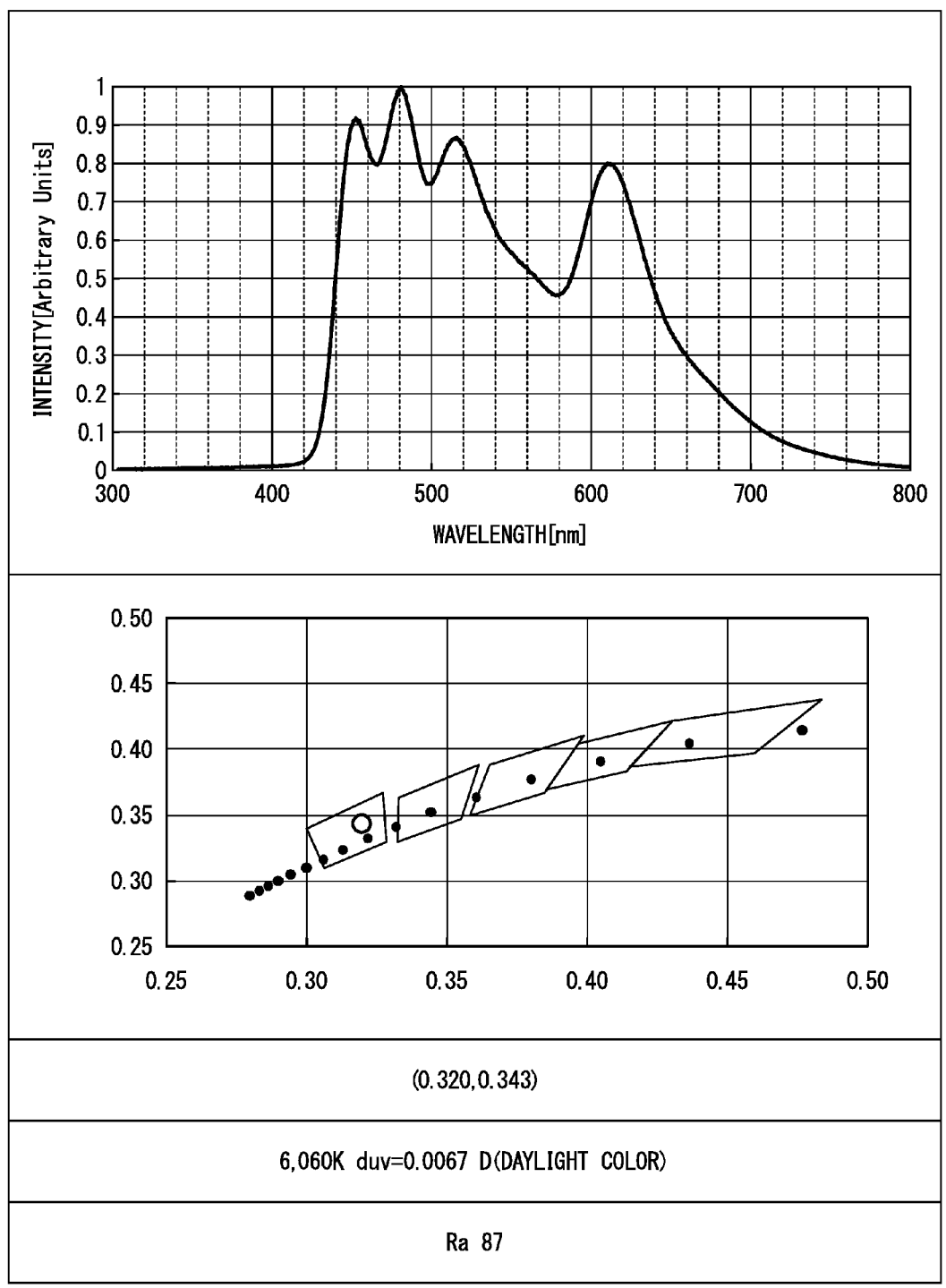
FIG. 14 is a diagram illustrating the evaluation result of the organic EL element according to Example 6.

In Example 6, an organic EL element having an element structure shown in FIG. 13 was manufactured by the same manufacturing method as that in Example 1. Then, the organic EL element according to Example 6 was evaluated by the same method as that in Example 1. The evaluation result is shown in FIG. 14.

As shown in FIGS. 4, 6, 8, 10, 12, and 14, all of the organic EL elements according to Examples 1 to 6 obtained white light with high color rendering properties. Therefore, it was proved that the lighting device including the organic EL element according to the invention could emit white light with high color rendering properties.

In Examples 5 and 6, there is a difference between the evaluation results (see FIGS. 12 and 14) due to a change in the current value even though the same element structure (see FIGS. 11 and 13) is used (current dependence). That is, the intensity ratio of green light to red light varies depending on the magnitude of a current value. For example, when the current value increases, the intensity ratio of green light to red light is reduced and the emission of light from the red light emitting layer is dominant over the emission of light from the green light emitting layer. Example 5 corresponds to the case in which the current value increases and the emission spectrum shown in FIG. 12 shows that the emission of light from the red light emitting layer is dominant.

Example 7

In Example 7, a lighting device in which an optical film was attached to the light emission surface (anode) of the organic EL element according to Example 1 was manufactured. Then, the lighting device according to Example 7 was evaluated by the same method as that in Example 1. The evaluation result is shown in FIG. 15.

Example 8

In Example 8, a lighting device in which an optical film was attached to the light emission surface (anode) of the organic EL element according to Example 1 was manufactured. Then, the lighting device according to Example 8 was evaluated by the same method as that in Example 1. The evaluation result is shown in FIG. 16.

Figure 15:
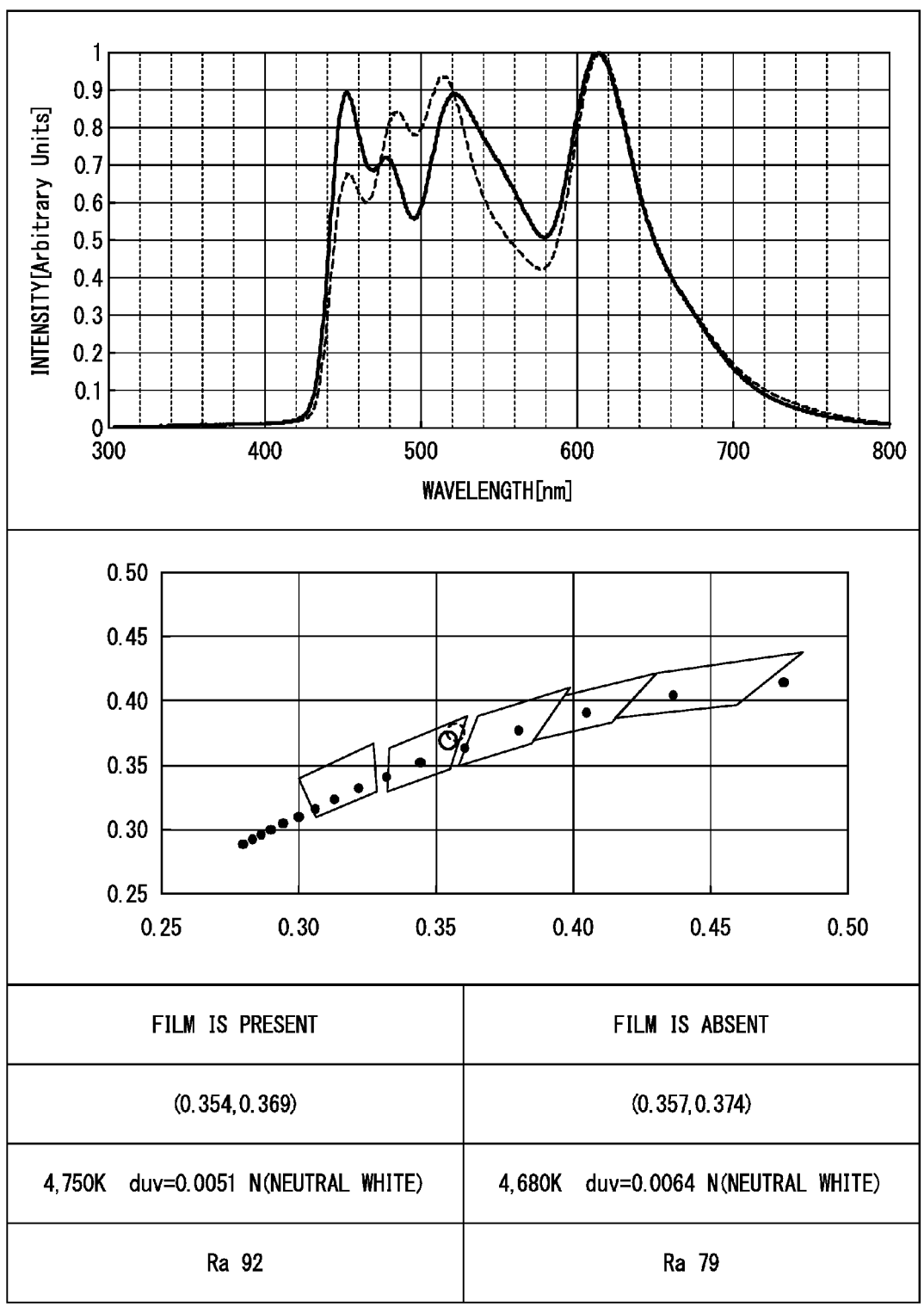
FIG. 15 is a diagram illustrating the evaluation result of a lighting device according to Example 7.
Figure 16:
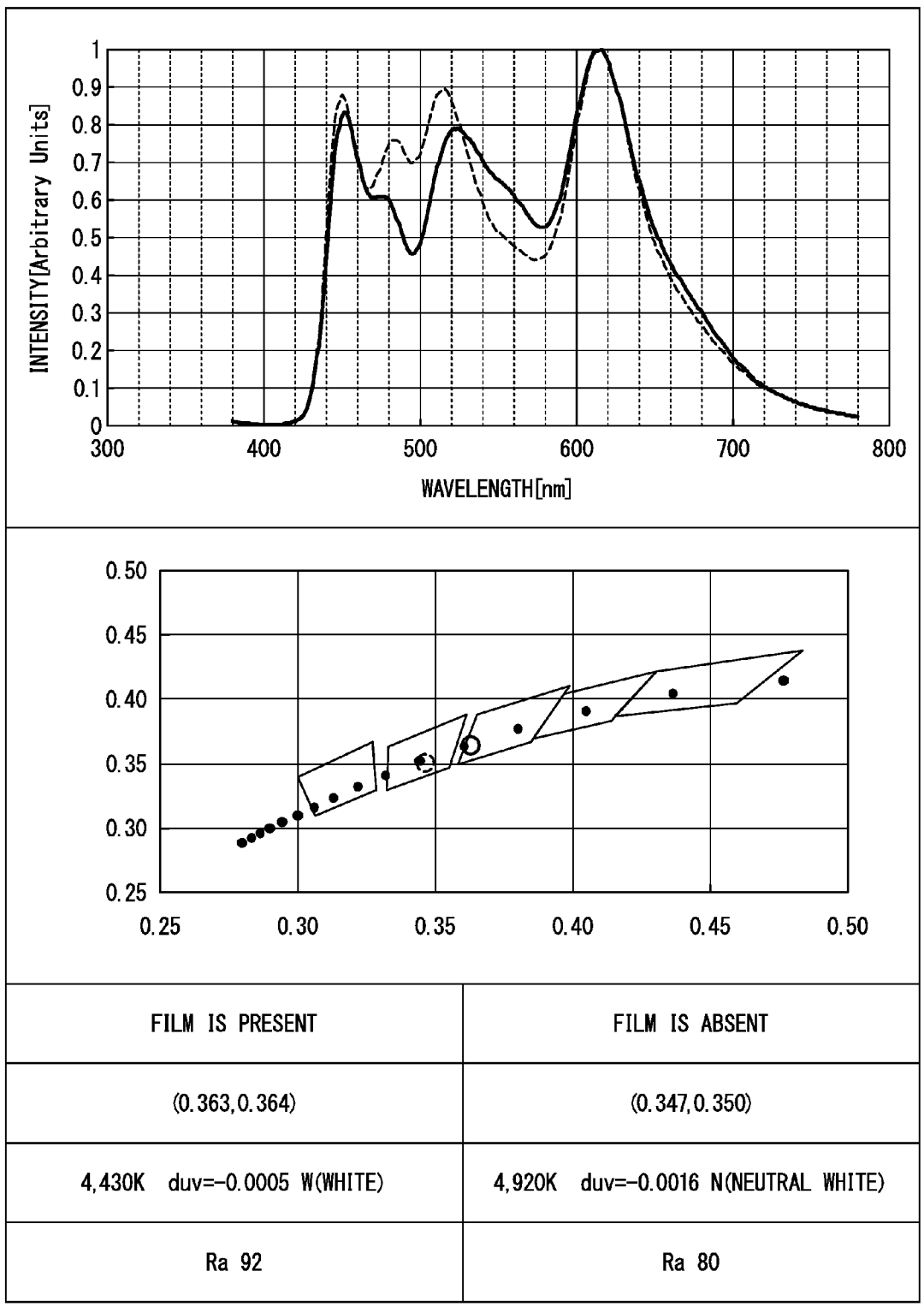
FIG. 16 is a diagram illustrating the evaluation result of a lighting device according to Example 8.

As can be seen from FIGS. 15 and 16, in the lighting devices according to Examples 7 and 8 in which the optical film is attached to the light emission surface (anode) of the organic EL element, the shape thereof is changed, as compared to the case in which the optical film is not attached (which is represented by a dashed line in FIGS. 15 and 16). In particular, of two peak wavelengths $p_3$ and $p_4$ in the blue wavelength range, the emission intensity of the peak wavelength $p_3$ on the long wavelength side is relatively lower than that of the other peak wavelength and a difference in emission intensity between the peak wavelength $p_3$ and the bottom wavelength $b_3$ which appears between the peak wavelengths $p_3$ and $p_4$ is reduced.

In the lighting device according to Example 7, Ra is 92, R9 is 95, and R15 is 90. In the lighting device according to Example 8, Ra is 92, R9 is 94, and R15 is 90. Therefore, in both the lighting devices according to Examples 7 and 8, excellent color rendering properties were obtained.

INDUSTRIAL APPLICABILITY

The invention can be applied to an organic electroluminescent element which can obtain white light with excellent color rendering properties and is suitable for a light source of a lighting device and a lighting device including the organic electroluminescent element.

REFERENCE SIGNS LIST

1: CATHODE
2: ANODE
21: FIRST LIGHT EMITTING UNIT
22: SECOND LIGHT EMITTING UNIT
31: CHARGE GENERATION LAYER (CGL)
S: EMISSION SPECTRUM
R: RED WAVELENGTH RANGE
G: GREEN WAVELENGTH RANGE
B: BLUE WAVELENGTH RANGE
$p_1$, $p_2$, $p_3$, $p_4$: PEAK WAVELENGTH
$b_1$, $b_2$, $b_3$: BOTTOM WAVELENGTH

The invention claimed is:
1. An organic electroluminescent element comprising:
a cathode;
an anode; and
a plurality of light emitting units that are provided between the cathode and the anode and include at least a light emitting layer made of an organic compound,
wherein white light emitted from the plurality of light emitting units has a continuous emission spectrum in a wavelength range of at least 380 nm to 780 nm, and
the emission spectrum includes one peak wavelength in a red wavelength range of 600 nm to 640 nm, one peak wavelength in a green wavelength range of 500 nm to 540 nm, and two peak wavelengths in a blue wavelength range of 440 nm to 490 nm,
the plurality of light emitting units include:
a first light emitting unit including a red phosphorescent layer that emits red light having one peak wavelength in the red wavelength range and a green phosphorescent layer that emits green light having one peak wavelength in the green wavelength range;
a second light emitting unit including a blue fluorescent layer that emits blue light having two peak wavelengths in the blue wavelength range,
the first light emitting unit and the second light emitting unit are laminated, with a charge generation layer interposed therebetween, and the anode, the second light emitting unit, the first light emitting unit, and the cathode are laminated respectively, in this order.

2. The organic electroluminescent element according to claim 1,
wherein, in the green and blue wavelength ranges, a gap between adjacent peak wavelengths is in a range of 15 nm to 50 nm.

3. The organic electroluminescent element according to claim 1,
wherein the emission intensity of one bottom wavelength between adjacent peak wavelengths in the red and green wavelength ranges is lower than the emission intensity of any one of two bottom wavelengths between adjacent peak wavelengths in the green and blue wavelength ranges.

4. The organic electroluminescent element according to claim 1,
wherein the color of the emitted white light is any one of a daylight color (D), neutral white (N), and white (W) in a chromaticity range defined by "JIS Z 9112".

5. The organic electroluminescent element according to claim 1,
wherein an average color rendering index, Ra of the white light is equal to or greater than 70.

6. The organic electroluminescent element according to claim 1, wherein the charge generation layer is an electrically insulating layer made of an electron accepting material and an electron donating material, and
the resistivity of the electrically insulating layer is equal to or greater than $1.0 \times 10^2$ Ω·cm.

7. The organic electroluminescent element according to claim 1, wherein the charge generation layer is a mixed layer of different materials in which one component is a metal oxide and the metal oxide forms a charge-transfer complex obtained by an oxidation reduction reaction, and
when a voltage is applied between the cathode and the anode, charges in the charge-transfer complex are moved to the Cathode and the anode, such that holes are injected into one light emitting unit which is disposed close to the cathode, with respect to the charge generation layer interposed between one light emitting unit and the other light emitting unit, and that electrons are injected into the other light emitting unit which is disposed close to the anode, with respect to the charge generation layer.

8. The organic electroluminescent element according to claim 1, wherein the charge generation layer is a laminate of the electron accepting material and the electron donating material, and
when a voltage is applied between the cathode and the anode, charges which are generated at an interface between the electron accepting material and the electron donating material by a reaction involving the movement of electrons between the electron accepting material and the electron donating material are moved to the cathode and the anode, such that holes are injected into one light emitting unit which is disposed close to the cathode, with respect to the charge generation layer interposed between one light emitting unit and the other light emitting unit, and that electrons are injected into the other light emitting unit which is disposed close to the anode, with respect to the charge generation layer.

9. The organic electroluminescent element according to claim 1, wherein the emission intensity of one bottom wavelength between adjacent peak wavelengths in the red and green wavelength ranges is lower than the emission intensity of both of two bottom wavelengths between adjacent peak wavelengths in the green and blue wavelength ranges.

10. The organic electroluminescent element according to claim 1, wherein the emission spectrum includes a bottom wavelength in a wavelength range of 490 nm to 510 nm.

11. The organic electroluminescent element according to claim 1, wherein the blue fluorescent layer is composed of a host material and a guest material: the guest material selected from the group consisting of a styrylamine compound, a fluoranthene compound, an amino pyrene compound, or a boron complex.

12. The organic electroluminescent element according to claim 2,
wherein, in the red and green wavelength ranges, a gap between adjacent peak wavelengths is equal to or greater than 60 nm.

13. The organic electroluminescent element according to claim 6,
wherein the resistivity of the electrically insulating layer is equal to or greater than $1.0 \times 10^5$ Ω·cm.

* * * * *